United States Patent
Aouini et al.

(10) Patent No.: US 10,425,099 B1
(45) Date of Patent: Sep. 24, 2019

(54) EXTREMELY-FINE RESOLUTION SUB-RANGING CURRENT MODE DIGITAL-ANALOG-CONVERTER USING SIGMA-DELTA MODULATORS

(71) Applicant: Ciena Corporation, Hanover, MD (US)

(72) Inventors: Sadok Aouini, Gatineau (CA); Ahmed Emara, Montreal (CA); Gordon Roberts, Montreal-West (CA); Mahdi Parvizi, Kanata (CA); Naim Ben-Hamida, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/203,738

(22) Filed: Nov. 29, 2018

(51) Int. Cl.
*H03M 3/00* (2006.01)
*H03M 1/10* (2006.01)

(52) U.S. Cl.
CPC .......... *H03M 3/38* (2013.01); *H03M 1/1009* (2013.01); *H03M 3/358* (2013.01); *H03M 3/392* (2013.01); *H03M 3/51* (2013.01)

(58) Field of Classification Search
CPC .......... H03M 3/38; H03M 3/51; H03M 3/358; H03M 3/392; H03M 1/1009
USPC .................................. 341/118, 120, 143–145
See application file for complete search history.

(56) References Cited

U.S. PATENT DOCUMENTS

| | | | |
|---|---|---|---|
| 5,977,899 A | * | 11/1999 | Adams .................... H03M 3/50 341/143 |
| 6,850,051 B2 | | 2/2005 | Roberts et al. |
| 7,035,269 B2 | | 4/2006 | Rolston et al. |
| 7,742,507 B1 | | 6/2010 | Kurowski et al. |
| 9,787,466 B2 | | 10/2017 | Aouini et al. |
| 9,941,897 B1 | * | 4/2018 | Li .......................... H03M 1/68 |
| 10,063,367 B1 | | 8/2018 | Aouini et al. |
| 2002/0019962 A1 | | 2/2002 | Roberts et al. |
| 2009/0121749 A1 | | 5/2009 | Roberts et al. |
| 2012/0288044 A1 | | 11/2012 | Roberts et al. |

* cited by examiner

*Primary Examiner* — Khai M Nguyen
(74) *Attorney, Agent, or Firm* — Clements Bernard Walker PLLC; Christopher L. Bernard; Lawrence A. Baratta, Jr.

(57) ABSTRACT

A X-bit Digital-to-Analog Converter (DAC) circuit includes an effective X/2-bit coarse DAC configured to produce a coarse bitstream (CBS) from a digital input $DC_1$ using an $n^{th}$ order Sigma-Delta ($\Sigma\Delta$) modulator, and to provide a coarse current source based on the CBS, wherein X is an even integer and n is an integer; an effective X/2-bit fine DAC configured to produce a fine bitstream (FBS) from a digital input $DC_2$ using a $1^{st}$ order $\Sigma\Delta$ modulator, and to provide a fine current source based on the FBS; and an output configured to form a voltage from the combination of the coarse current source and the fine current source.

20 Claims, 14 Drawing Sheets

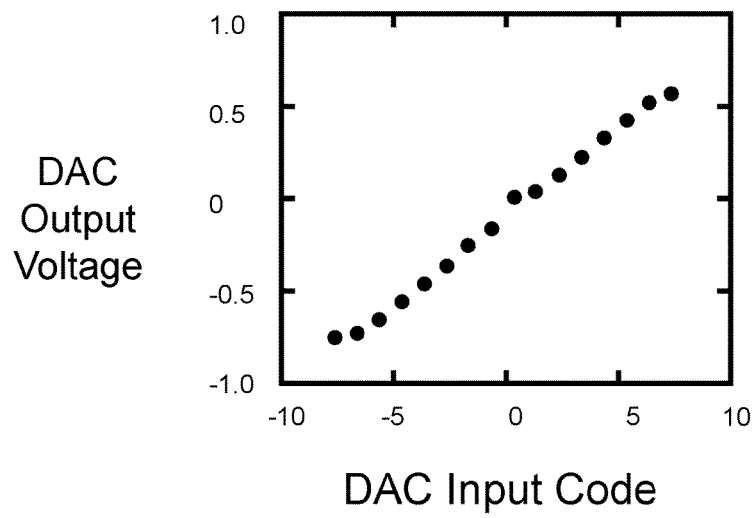
FIG. 2
Prior Art
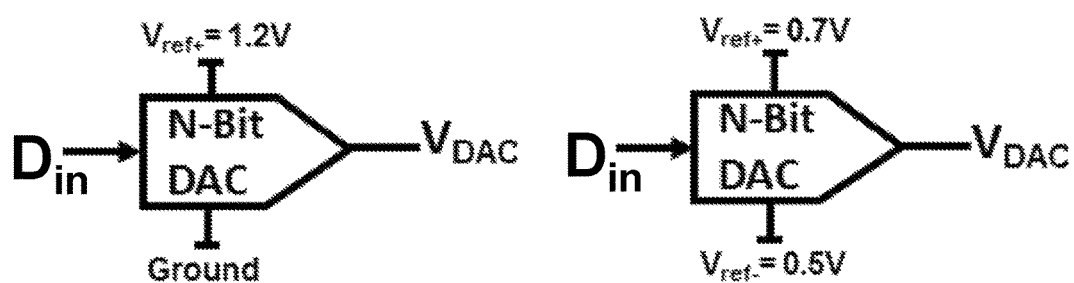
FIG. 3(a)
Prior Art
FIG. 3(b)
Prior Art

$V_{dd}=1.2V$, $V_{ss}=0V$, $B.W_{MOD}=10kHz$ and $OSR=100$

| ΣΔ Order | Range | Range as % of FSR |
|---|---|---|
| 1st Order | 0V→1.2V | 100% |
| 2nd Order | 0.0055V→1.1945V | 99.08% |
| 3rd Order | 0.1784V→1.0216V | 70.48% |
| 4th Order | 0.2652V→0.9348V | 56.61% |
| 5th Order | 0.3704V→0.8296V | 38.62% |

$f_c$: cut-off frequency of the LPF
B.W$_{MOD}$: Modulator Bandwidth
R: Ripples value at the output

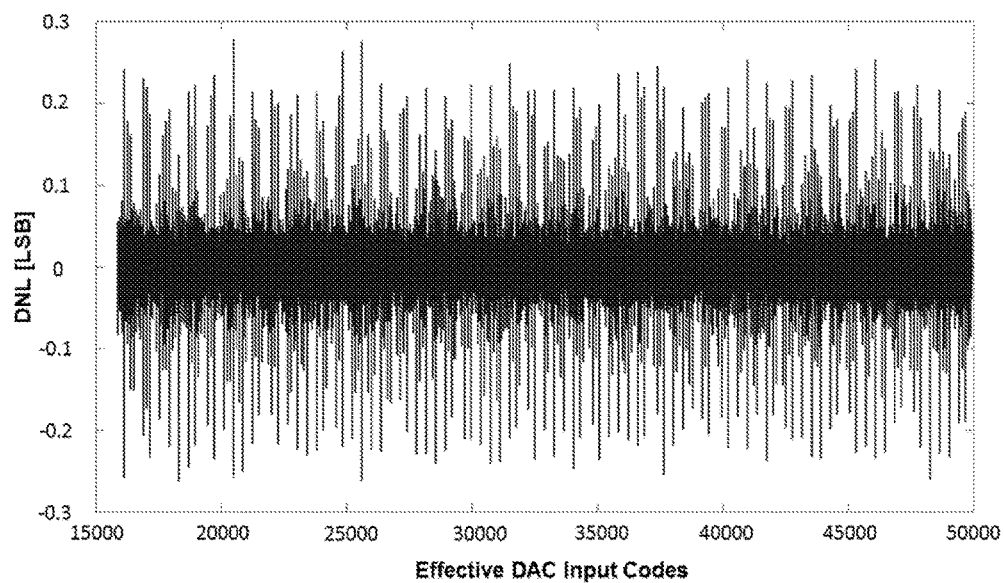
FIG. 9  DNL Curve
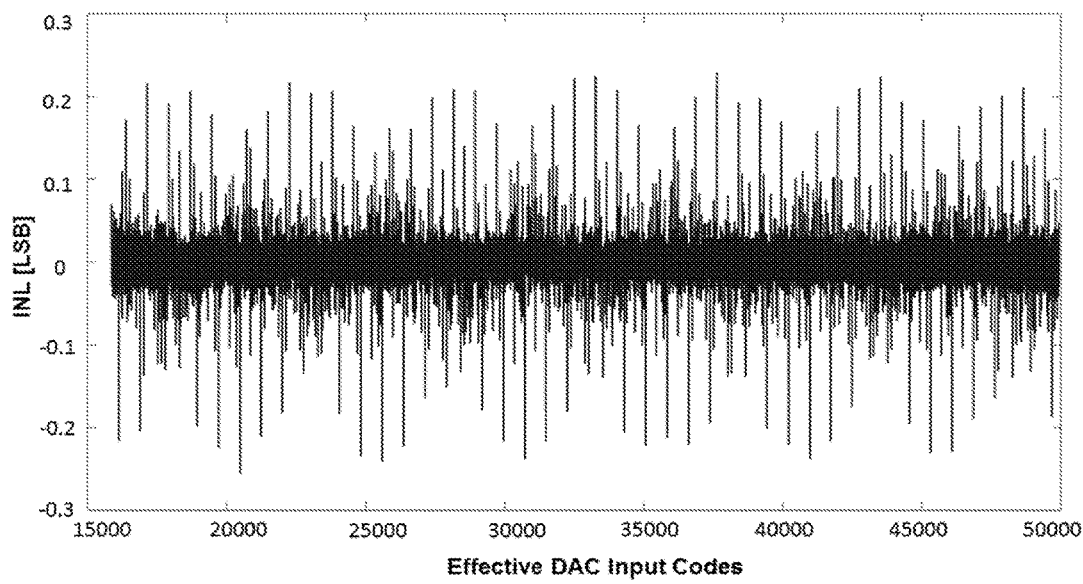
FIG. 10  INL Curve

EXTREMELY-FINE RESOLUTION SUB-RANGING CURRENT MODE DIGITAL-ANALOG-CONVERTER USING SIGMA-DELTA MODULATORS

FIELD OF THE DISCLOSURE

The present disclosure generally relates to a Digital-to-Analog Converter (DAC) circuit. More particularly, the present disclosure relates to an extremely-fine resolution sub-ranging current mode Digital-Analog-Converter (DAC) using Sigma-Delta ($\Sigma\Delta$) modulators.

BACKGROUND OF THE DISCLOSURE

Digital-to-Analog Converters (DACs) are decoding devices (electrical circuits) that convert digital data to its corresponding analog signal. FIG. 1 is a block diagram of a DAC with digital inputs $b_1, b_2, \ldots, b_D$ and an analog output and of a graph of (ideal) DAC output voltage versus DAC input code. FIG. 2 is a graph of actual DAC output voltage versus DAC input code. Note, in actuality, the DAC output voltage is not ideal, and there are various static and dynamic measures of DAC performance. Static measures include Differential Non-Linearity (DNL) error, Integral Non-Linearity (INL) error, Monotonicity, Offset Error, Gain Error. Dynamic measures include Glitch, Settling Time, Signal-to-Noise Ratio (SNR), Spurious-Free Dynamic Range (SFDR), and the like.

In many applications, the use of DACs is straightforward. However, in some other applications, high-resolution DACs are used for calibration purposes. For example, Calibration DACs (CDACs) can be used to control the gain of a circuit that includes Op amps and 8 resistors; an 8-bit calibration DAC was used to make gain and offset adjustments in a pressure sensor, etc. FIGS. 3(a) and 3(b) are circuit diagrams of an ordinary DAC (FIG. 3(a)) and a Calibration DAC (FIG. 3(b)).

FIGS. 4(a)-4(e) are diagrams of various different types of DACs including a Thermometer-coded DAC (FIG. 4(a)), a binary weighted DAC (FIG. 4(b)), Pulse Width Modulated (PWM) DAC (FIG. 4(c)), a Pulse Density Modulated (PDM) DAC (FIG. 4(d), and a hybrid DAC (FIG. 4(e)). Of course, each of these architectures has their own pros and cons in terms of resolution, area occupancy, power consumption, monotonicity and settling times. Thermometer-coded DACs use $2^N-1$ equal size number of elements (current sources, resistors or capacitors). For instance, designing an 8-bit current mode DAC using this architecture would require using 255 current sources of equal quantity. This is the reason the digital input must be in the form of a thermometer code, and a thermometer decoder is needed to convert binary inputs into thermometer codes. The main advantage of this architecture is guaranteed monotonicity. However, area occupancy and power consumption are high. That is the reason they are rarely used for high-resolution DACs.

Binary weighted DACs utilize a binary weighted number of elements. For example, designing an 8-bit current-mode DAC using this architecture would require using 8 current sources only, which makes it area efficient compared to its thermometer-coded counterpart. One of the drawbacks of this architecture is that for high-resolution designs (>10 bits), the difference between the Most Significant Bits (MSBs) and Least Significant Bits (LSBs) weights is large and the output becomes very sensitive to mismatch errors and glitches. This might lead to a non-monotonic DAC. In addition, the number of elements (current sources) that needs calibration is still high.

The output of PWM DAC is set by the ratio of the time the digital bitstream is logic high to the total time of one period. This averaging operation is done by feeding the bitstream to a Low Pass Filter (LPF) to obtain the desired output. PWM DACs work by continuously switching a constant current or voltage by some amount of time into an LPF. The DC output value depends on the duty cycle (D) of the input.

The PDM DAC's theory of operation is close to that of PWM DACs. However, in PDM the digital bitstream is generated using $\Sigma\Delta$ modulators. It has been shown previously that PDM is a more viable technique than PWM. PDM requires smaller filters, which means small implementation area and faster settling times. PDM maximizes the fundamental frequency of the output periodic signal, thus simplifying the filtering significantly. Therefore, it has an advantage over its PWM counterpart.

Hybrid DACs use a combination of the architectures indicated above. The most common type of hybrid DACs is the segmented (Two-Path) DAC. In this DAC, the thermometer-coded architecture is used for the MSBs, and the binary weighted one is used for the LSBs. This makes use of the advantages offered by the two architectures. Segmented DACs are often used to design high resolution and low area/power devices. However, it is always a challenge to find the optimum number of segmentations, i.e., the number of bits that should be thermometer-coded. In addition, the need of the complex circuitry for the thermometer-coded architecture is not totally resolved in segmented DACs.

For high-resolution DACs, Dynamic Element Matching (DEM) is widely used to compensate for matching errors that affect the linearity of the DAC. This technique is implemented using encoders which are complex and burn a lot of energy.

BRIEF SUMMARY OF THE DISCLOSURE

In an embodiment, a X-bit Digital-to-Analog Converter (DAC) circuit includes an effective X/2-bit coarse DAC configured to produce a coarse bitstream (CBS) from a digital input $DC_1$ using an $n^{th}$ order Sigma-Delta ($\Sigma\Delta$) modulator, and to provide a coarse current source based on the CBS, wherein X is an even integer and n is an integer; an effective X/2-bit fine DAC configured to produce a fine bitstream (FBS) from a digital input $DC_2$ using a $1^{st}$ order $\Sigma\Delta$ modulator, and to provide a fine current source based on the FBS; and an output configured to form a voltage from the combination of the coarse current source and the fine current source. A first 1-bit DAC is configured to provide the coarse current source based on the CBS, and a second 1-bit DAC is configured to provide the fine current source based on the FBS. A combination of the $\Sigma\Delta$ modulators and each of the first 1-bit DAC and the second 1-bit DAC provides the X-bit resolution. Each of the 1-bit DACs can be configured to provide a current value if the respective CBS and FBS are logically high and no current if the respective CBS and FBS are logically low. The value of n represents the $\Sigma\Delta$ modulator order to be used for the coarse DAC and can be selected based on the desired linear range of operation. The DAC circuit can further include a Low Pass Filter (LPF) configured to receive the combination of the coarse current source and the fine current source and to provide the output. An order of the LPF can match an order of the $n^{th}$ order $\Sigma\Delta$ modulation. The DAC circuit can be calibrated by matching the coarse current source and the fine current source.

In another embodiment, an integrated circuit includes a coarse Digital-to-Analog Converter (DAC) including an $n^{th}$ order Sigma-Delta ($\Sigma\Delta$) modulator that receives a digital input $DC_1$ and outputs a coarse bitstream (CBS), and a coarse 1-bit DAC that operates on the CBS to provide a coarse current source; a fine DAC including an $1^{st}$ order $\Sigma\Delta$ modulator that receives a digital input $DC_2$ and outputs a fine bitstream (FBS), and a fine 1-bit DAC that operates on the FBS to provide a fine current source; a summing element connected to the coarse current source and the fine current source; and a Low Pass Filter (LPF) connected to the summing element and configured to provide a voltage at an output, the voltage formed as a combination of the coarse current source and the fine current source. Each of the coarse 1-bit DAC and the fine 1-bit DAC are configured to provide a current value if the respective CBS and FBS are logically high and no current if the respective CBS and FBS are logically low. A value of n in the $n^{th}$ order $\Sigma\Delta$ modulator can be selected based on a linear range of operation. An order of the LPF can match an order of the $n^{th}$ order $\Sigma\Delta$ modulation. The integrated circuit can further include level-shifting circuitry configured to convert the CBS and the FBS from a full swing input waveform to a moderate swing input waveform. The integrated circuit can be calibrated by matching the coarse current source and the fine current source.

In a further embodiment, a method of operating a Digital-to-Analog Converter (DAC) circuit includes, at a coarse DAC, receiving a digital input $DC_1$, applying $n^{th}$ order Sigma-Delta ($\Sigma\Delta$) modulation on the digital input $DC_1$ to produce a coarse bitstream (CBS), and providing a coarse current source based on the CBS; at a fine DAC, receiving a digital input $DC_2$, applying $1^{st}$ order Sigma-Delta ($\Sigma\Delta$) modulation on the digital input $DC_2$ to produce a fine bitstream (FBS), and providing a fine current source based on the FBS; and providing a voltage at an output, the voltage formed as a combination of the coarse current source and the fine current source. A first 1-bit DAC is configured to provide the coarse current source based on the CBS; and a second 1-bit DAC is configured to provide the fine current source based on the FBS. The value of n represents the $\Sigma\Delta$ modulator order to be used for the coarse DAC and can be selected based on the desired linear range of operation. The method can further include utilizing a Low Pass Filter (LPF) to receive the combination of the coarse current source and the fine current source and to provide the output. The method can further include utilizing level-shifting circuitry to convert the CBS and the FBS from a full swing input waveform to a moderate swing input waveform. The method can further include calibrating digitally by matching the coarse current source and the fine current source.

BRIEF DESCRIPTION OF THE DRAWINGS

The present disclosure is illustrated and described herein with reference to the various drawings, in which like reference numbers are used to denote like system components/method steps, as appropriate, and in which:

FIG. 2 is a graph of actual DAC output voltage versus DAC input code;

FIGS. 3(a) and 3(b) are circuit diagrams of an ordinary DAC (FIG. 3(a)) and a Calibration DAC (FIG. 3(b));

FIG. 9 is a Differential Nonlinearity (DNL) curve to verify the DAC functionality;

FIG. 10 is an Integral Nonlinearity (INL) curve to verify the DAC functionality;

DETAILED DESCRIPTION OF THE DISCLOSURE

The present disclosure relates to an extremely-fine resolution sub-ranging current mode Digital-Analog-Converter (DAC) using Sigma-Delta ($\Sigma\Delta$) modulators. Specifically, a high-resolution, area/power efficient, monotonic DAC is presented herein, which is simple to calibrate as only two level adjustments are required. The proposed DAC design is based on sub-ranging and segmentation using two 1-bit Sigma-Delta ($\Sigma\Delta$) encoded bitstreams. In an embodiment, a 16-bits resolution DAC is achieved by using two 8-bits $\Sigma\Delta$ modulators instead of one 16-bits $\Sigma\Delta$ modulator. This offers area and power savings. In addition, the proposed DAC calibration is quick and efficient as only two-level adjustments are required because only two currents ($I_{coarse}$ and $I_{fine}$) need to be matched.

In an embodiment, the proposed DAC architecture described herein can be used in the low-speed, high-resolution DACs and ADCs for the electro-optics control loops. For instance, it could be used to control the gain of a Transimpedance Amplifier (TIA). In addition, the proposed DAC architecture can be used by built-in test circuitry by generating accurate reference voltages and/or currents.

DAC Using Sigma-Delta ($\Sigma\Delta$) Modulators

Figure 1:
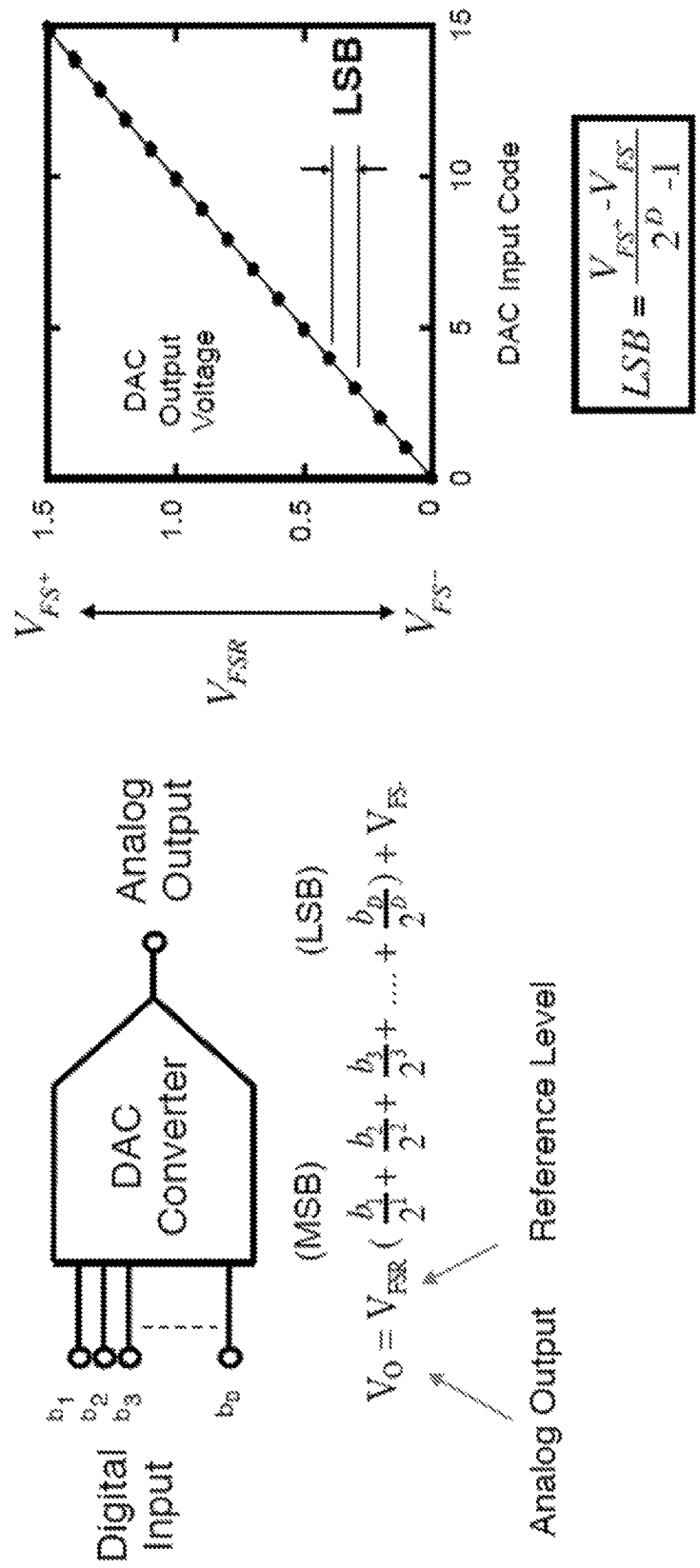
FIG. 1 is a block diagram of a DAC with digital inputs $b_1$, $b_2$, . . . , $b_D$ and an analog output and of a graph of (ideal) DAC output voltage versus DAC input code.
Figure 4A:
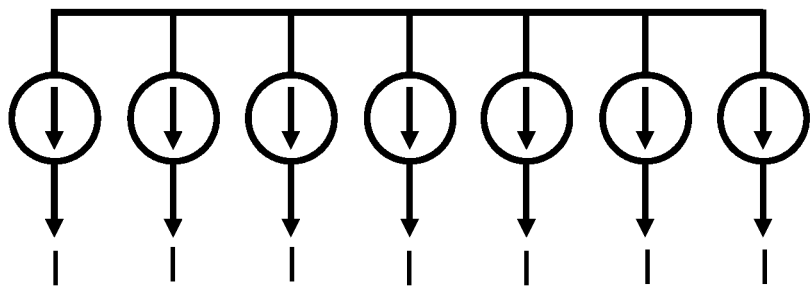
FIGS. 4(a)-4(e) are diagrams of various different types of DACs including a Thermometer-coded DAC (FIG. 4(a)), a binary weighted DAC (FIG. 4(b)), Pulse Width Modulated (PWM) DAC (FIG. 4(c)), a Pulse Density Modulated (PDM) DAC (FIG. 4(d), and a hybrid DAC (FIG. 4(e))
Figure 4B:
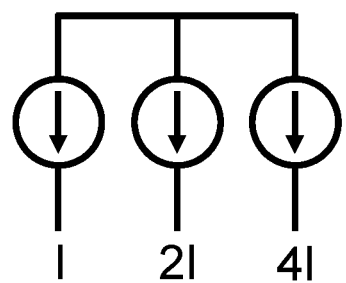
Figure 4C:
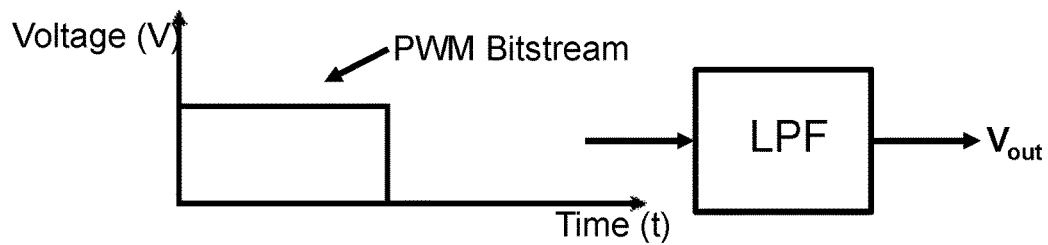
Figure 4D:
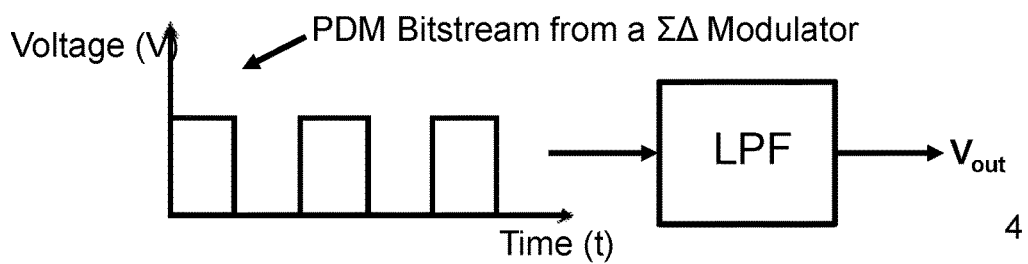
Figure 4E:
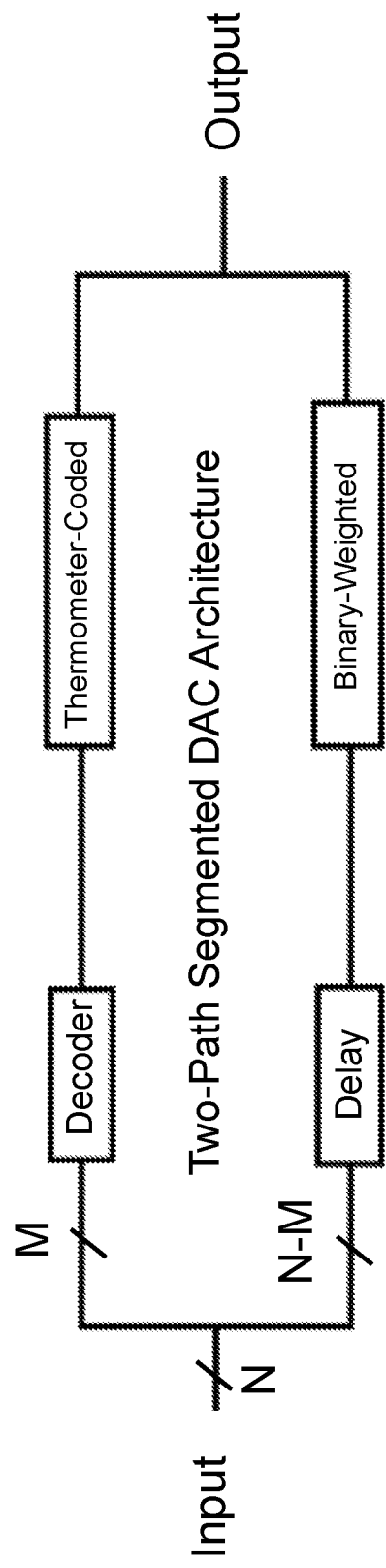
Figure 5:
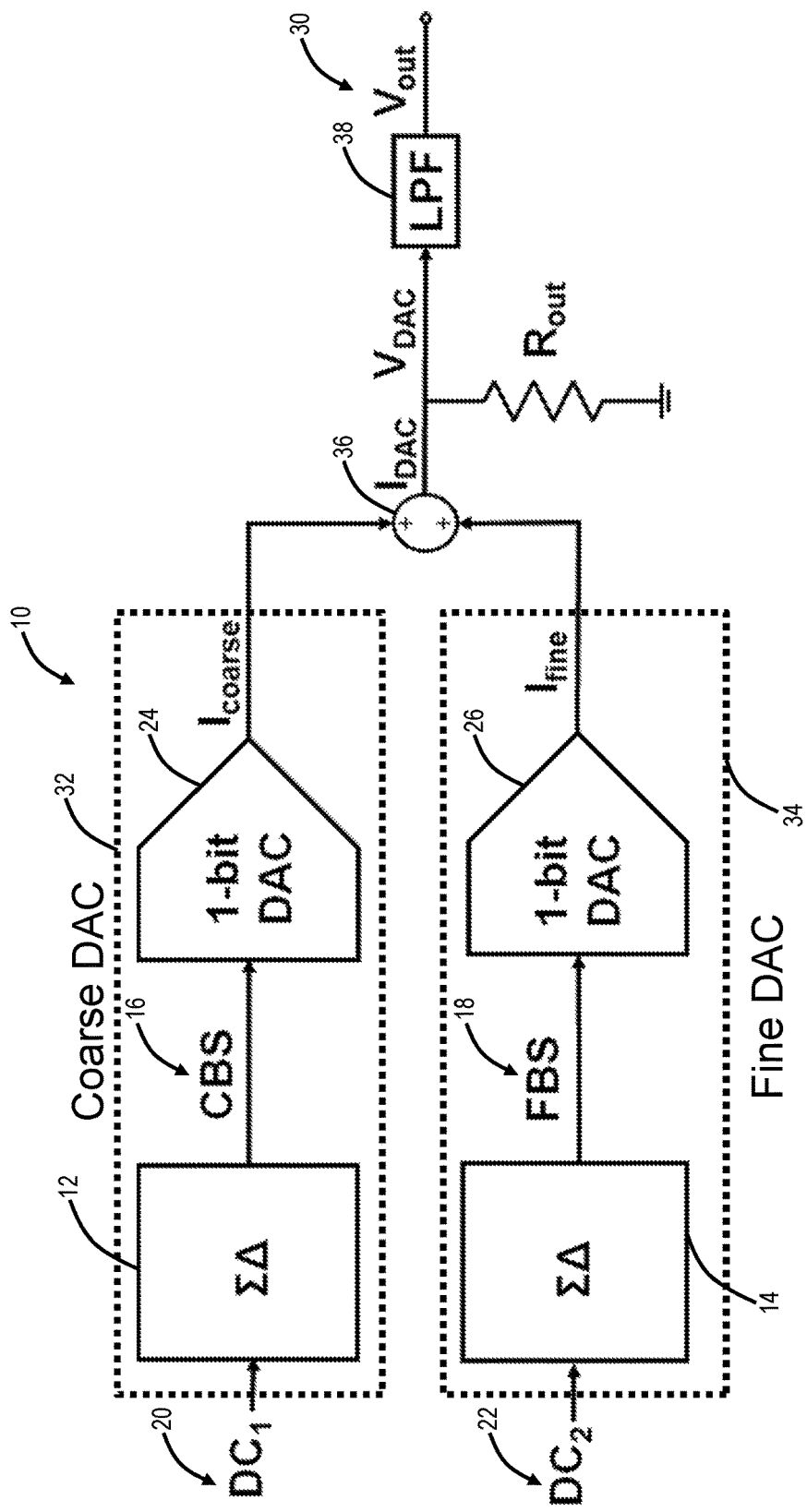
FIG. 5 is a block diagram of the 16-bit DAC using two Sigma-Delta ($\Sigma\Delta$) modulators.

FIG. 5 is a block diagram of a 16-bit DAC 10 using two Sigma-Delta ($\Sigma\Delta$) modulators 12, 14. Again, the DAC 10 is a high-resolution, area/power efficient, monotonic DAC, which is simple to calibrate as only two-level adjustments are required. The DAC 10 is built using two 1-bit Sigma-Delta ($\Sigma\Delta$) encoded bitstreams 16, 18 having an in-band resolution equivalent to 8-bits. It is the combination of the $\Sigma\Delta$ modulator 12, 14 with each 1-bit DAC 24, 26, that achieves the 8-bit resolution.

The DAC 10's output ($V_{out}$) 30 is the contribution of two DACs, a coarse DAC 32 and a fine DAC 34. In FIG. 5, the upper path is the coarse DAC 32, that accepts digital input 20 $DC_1$ as input, which is fed to an $n^{th}$ order $\Sigma\Delta$ modulator 12 and produces a coarse $\Sigma\Delta$ encoded bitstream (Coarse Bitstream (CBS)) 16. Similarly, the lower path in FIG. 5 is the fine DAC 34 that accepts digital input 22 $DC_2$ as input, which is fed to a $1^{st}$ order $\Sigma\Delta$ modulator 14 and produces a fine $\Sigma\Delta$ encoded bitstream (Fine Bitstream (FBS)) 18. The $n^{th}$ order $\Sigma\Delta$ modulator is selected based on the desired linear range of operation. While the fine DAC is a $1^{st}$ order ΣΔ modulator to provide all the fine transitions within a coarse transition.

The bitstreams CBS 16 and FBS 18 are applied to two 1-bit DACs 24, 26. The 1-bit DAC 24, 26 mimics a current source that is controlled by CBS 16 and FBS 18. So, if CBS 16 is logic 'high' a current value $I_{coarse}$ is passed, otherwise, no current. This is similar for the fine DAC 34, namely if FBS 18 is logic 'high' a current value $I_{fine}$ is passed, otherwise no current. The fine current $I_{fine}$ is a downscaled value of $I_{coarse}$ to apply sub-ranging. The two current values $I_{coarse}$ and $I_{fine}$ are summed together via a summing element 36 yielding the current $I_{DAC}$. $I_{DAC}$ is converted to a voltage ($V_{DAC}$) through a resistor ($R_{out}$). The voltage ($V_{DAC}$) is then applied to a Low Pass Filter (LPF) 38 producing the output analog voltage ($V_{out}$) 30.

Figure 6:
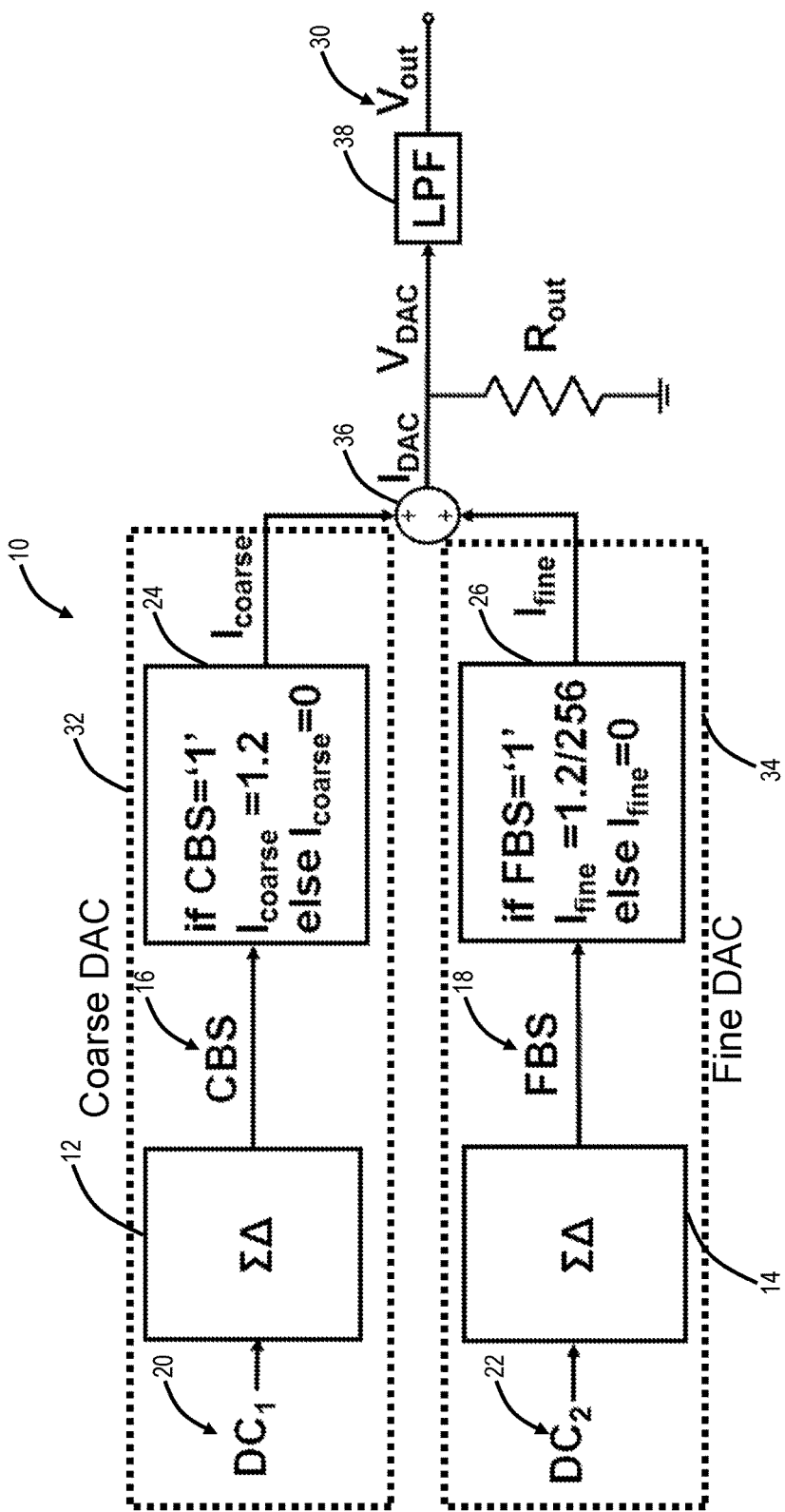
FIG. 6 is a behavioral model of a 16-bit DAC design example using two Sigma-Delta ($\Sigma\Delta$) modulators.

FIG. 6 shows the behavioral model of a 16-bit DAC 10 design example using two Sigma-Delta (ΣΔ) modulators 12, 14. To validate the proposed solution, the design was simulated using MATLAB and SIMULINK. Those of ordinary skill in the art will appreciate other values for the DAC 10 are contemplated. For this example, the sampling frequency (Fs) is 2 MHz, oversampling ratio (OSR) is chosen to be 100, with a modulator bandwidth ($BW_{mod}$) 10 kHz, supply voltage ($V_{dd}$) is 1.2V and ground ($V_{ss}$) is 0V.

The 16-bit DAC 10 is made up of two 8-bits effective resolution DACs, coarse and fine. It is the combination of the ΣΔ modulator 12, 14 with each 1-bit DAC 24, 26, that achieves the 8-bit resolution. In this design example, CBS 16 is generated using a $4^{th}$ order ΣΔ modulator 12. This choice depends on how the DAC 10 will be used. The table in FIG. 7 could be used as a look-up table when designing for other different applications. FBS 18 is generated using a $1^{st}$ order ΣΔ modulator 14, to provide all the fine transitions within a coarse transition.

In this example, the 1-bit coarse DAC 24 produces an output current of 1.2 A, if CBS 16 is logic 'high,' otherwise no current is passed. The 1-bit fine DAC 26 works in a similar way, if FBS 18 is logic 'high,' an output current of 1.2/256 A is supplied. Otherwise, no current is provided. To sub-divide the coarse levels, the current value $I_{fine}$ is a downscaled value of $I_{coarse}$. The two current values $I_{coarse}$ and $I_{fine}$ are summed together at the current summing node yielding the current $I_{DAC}$. $I_{DAC}$ is converted to a voltage ($V_{DAC}$) through a resistor ($R_{out}$). The voltage ($V_{DAC}$) is then applied to an LPF producing the output analog voltage ($V_{out}$). The following equations apply:

$$I_{fine} = \frac{I_{coarse}}{2^n}$$

$$I_{DAC} = I_{coarse} + I_{fine}$$

$$V_{DAC} = I_{DAC} \times R_{out}$$

where n is the resolution of one of the DACs, in this example n is 8.

The output analog voltage ($V_{out}$) 30 of the DAC 10 is given by $$V_{out} = (I_{coarse} + I_{fine}) * R_{out}$$

In this example, the $I_{coarse}$ current needs to be exactly 256 times the value of the $I_{fine}$ current. If there is a mismatch, it can be measured on the tester during the production test phase; then, this mismatch can be canceled digitally using the following relationship:

$$\alpha = I_{coarse-ideal} / I_{coarse-measured}.$$

where α is a calibration parameter.

Note that $I_{coarse-ideal} = 256 * I_{fine}$. Every DC1 value gets multiplied by α. For instance, if DC1 (coarse DAC input) is equal to 150/256, DC2 (fine DAC input) is equal to 107/256 and α is equal to 0.9, then the pre-compensated code that gets sent to the coarse DAC is set to 150*0.9=135. Then the total output voltage is equal to $$V_{DAC} = 150/256 * \alpha * I_{coarse} + 107/256 * I_{fine} = 135/256 * I_{coarse} + 107/256 * I_{fine}.$$

Figure 7:
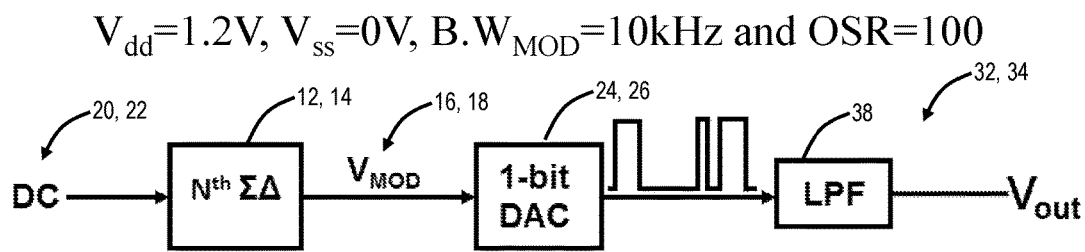
FIG. 7 is a diagram and table illustrating the effect of using different $\Sigma\Delta$ modulator orders on the linear range of operation.

FIG. 7 is a diagram and table illustrating the effect of using different ΣΔ modulator orders on the linear range of operation. After choosing the ΣΔ modulator orders, two main design aspects need to be carefully picked up for the LPF 38. Namely, the order of the filter and the cut-off frequency.

Figure 8:
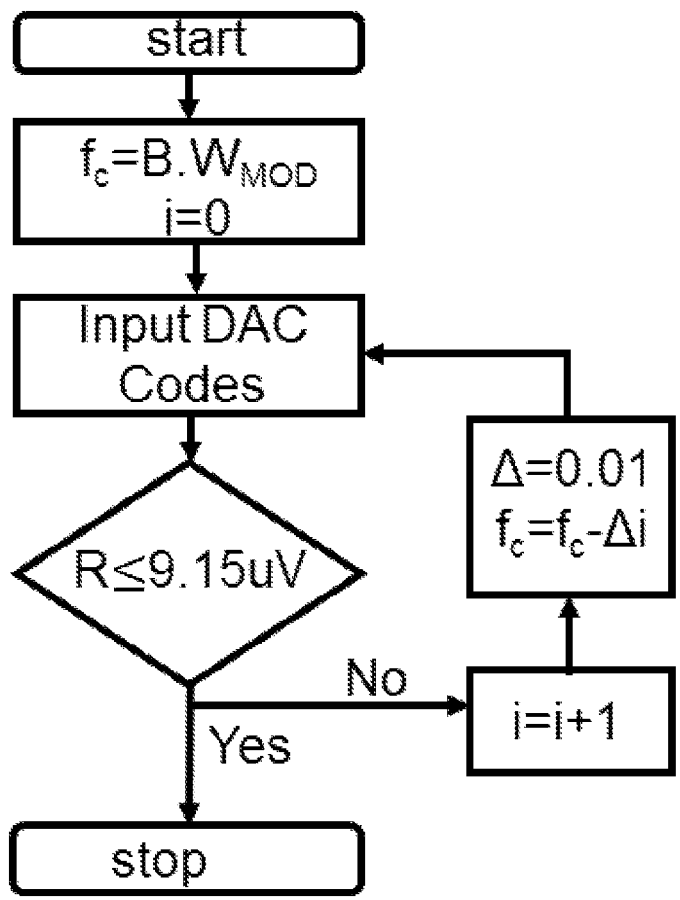
FIG. 8 is a flowchart of a cut-off frequency ($f_c$) selection algorithm process for the LPF.

Most often high order Butterworth filters are used. For this design example a fourth order Butterworth filter is used. After choosing the order of the filter, the cut-off frequency ($f_c$) need to be determined. FIG. 8 is a flowchart of a cut-off frequency ($f_c$) selection algorithm process. The cut-off frequency should be equal to the bandwidth of the modulator used or lower. Initially, 10 kHz (bandwidth of the modulator) is chosen as the cut-off frequency of the LPF 38, then the maximum ripple is computed for every input code that is in the region of operation. If the maximum ripples (R) exceeds half the LSB of 16-bit resolution, i.e., 9.15 uV in this example, $F_c$ would be decreased. This process would be repeated until the ripples become 9.15 uV or lower. After running the process, $f_c$ was found to be 4.5 kHz.

Transfer curve tests are performed to verify the DAC 10 functionality. FIG. 9 is a Differential Nonlinearity (DNL) curve, and FIG. 10 is an Integral Nonlinearity (INL) curve. The DNL peaks are 0.279 LSB and −0.262 LSB, while the INL peaks are 0.229 LSB and −0.256 LSB. DNL and INL were computed using the ideal line technique.

DAC Size

In the example described above, it is the combination of the ΣΔ modulator with each 1-bit DAC that achieves the effective 8-bits resolution of the coarse and fine DAC, yielding an overall resolution of 16-bits. This can be generalized to support an X-bit DAC which is formed by an effective X/2-bit coarse and fine DAC using a 1-bit DAC and the ΣΔ modulator, where X is an even integer. For example, a 14-bit DAC can be formed by effective 7-bits resolution of the coarse and fine DAC, a 12-bit DAC can be formed by effective 6-bits resolution of the coarse and fine DAC, etc. All with 1-bit DACs and ΣΔ modulators.

DAC Integrated Circuit

In an embodiment, a DAC 10 includes a coarse DAC 32 configured to receive a digital input $DC_1$ 20, applied to an $n^{th}$ order Sigma-Delta (ΣΔ) modulator (12), to produce a coarse bitstream (CBS) 16, and provide a coarse current source ($I_{coarse}$) from the CBS 16; a fine DAC 34 configured to receive a digital input $DC_2$ 22, applied to a $1^{st}$ order ΣΔ modulator (14), to produce a fine bitstream (FBS) 18, and provide a fine current source (km) from the FBS 18; and an output 30 which is a voltage formed as a combination of the coarse current source ($I_{coarse}$) and the fine current source ($I_{fine}$). The DAC 10 can also include a coarse 1-bit DAC 24 configured to provide the coarse current source from the CBS 16, and a fine 1-bit DAC 26 configured to provide the fine current source from the FBS 18. The DAC circuit of claim 2, wherein each of the coarse 1-bit DAC 24 and the fine 1-bit DAC 26 are configured to provide a current value if the respective CBS 16 and FBS 18 are logically high and no current if the respective CBS 16 and FBS 18 are logically low. The ΣΔ modulator order n is selected based on the desired linear range of operation. The ΣΔ modulator 14, should be a first order modulator to provide all the necessary fine transitions within one coarse transition.

The DAC 10 can also include a Low Pass Filter (LPF) 38 configured to receive the combination of the coarse current source ($I_{coarse}$) and the fine current source ($I_{fine}$) and to provide the output 30. The DAC 10 is calibrated by matching the coarse current source ($I_{coarse}$) and the fine current source ($I_{fine}$) using a calibration parameter.

Circuit Implementation

The proposed DAC 10 can be designed and fabricated in an Integrated Circuit (IC) using a 65 nm Complementary Metal-Oxide-Semiconductor (CMOS) process. It is very common to implement current mode DACs as they are simple to realize. The most well-known current mode architecture is the Current steering DAC (CS-DAC), and it is used in the design of the proposed DAC 10. The DAC 10 design includes building blocks that are presented in the following subsections. The building blocks can include current sources and switches building the DAC core and the LPF, level-shifters, and drivers are peripheral circuits.

Figure 11:
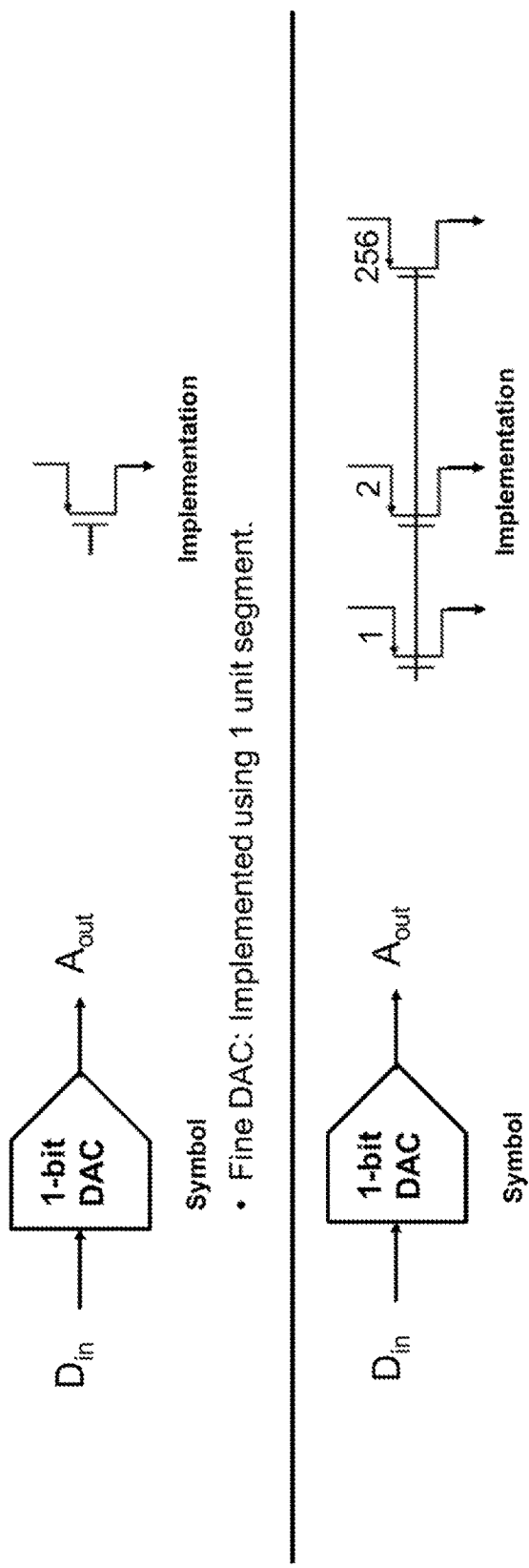
FIG. 11 is a diagram of CS-DACs for the fine 1-bit DAC 26 and the coarse 1-bit DAC.
Figure 12:
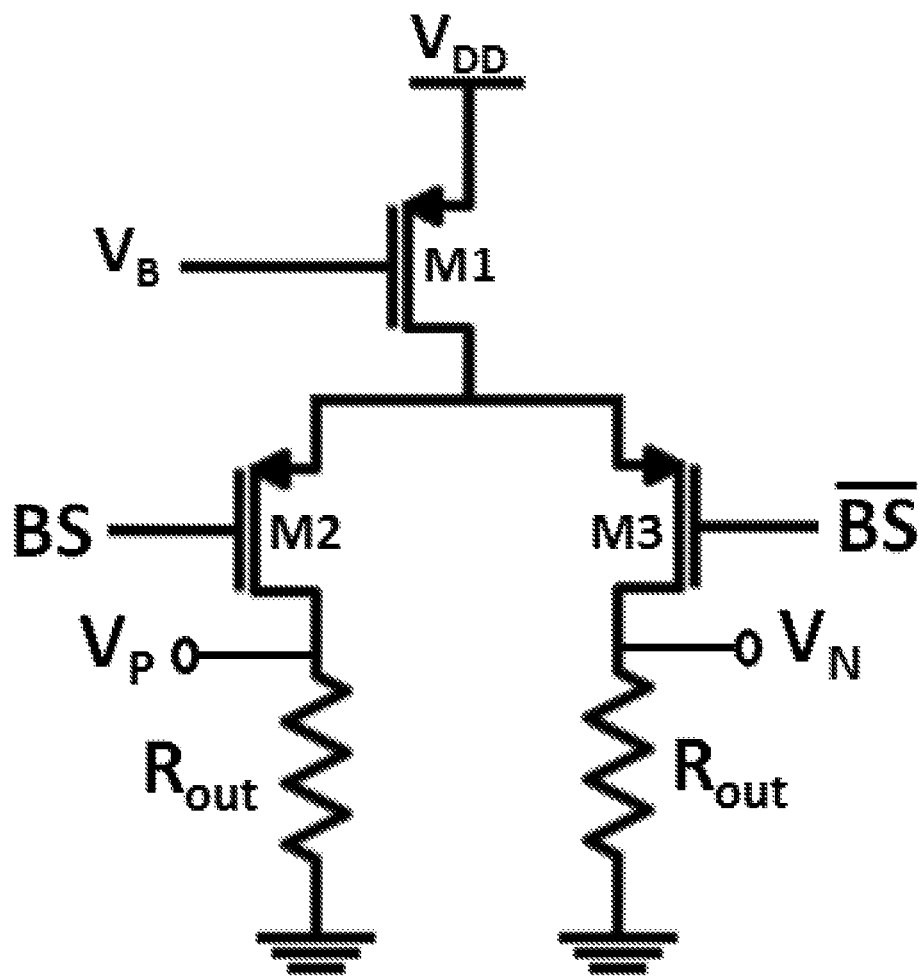
FIG. 12 is a circuit diagram of a current cell.

FIG. 11 is a diagram of CS-DACs for the fine 1-bit DAC 26 and the coarse 1-bit DAC 24. CS-DACs are implemented using current sources and current switches, which make up the DAC core. One current source and one current switch (differential pair) make a current cell. FIG. 12 is a circuit diagram of a current cell used in the DAC 10. It should be noted that in this design a 2.5V (high voltage) is used as the supply, to allow for more headroom, i.e., to increase the analog output range. Since high supply voltage is powering up the circuit, thick gate oxide transistors are used, that has a nominal Input/Output (I/O) voltage of 2.5V. The minimum width and length of these transistors are 400 nm.

Transistors M2 and M3 are the differential pair that makes up the current switch. Transistors M2 and M3 operate in the saturation region when they are turned on, serving as a cascade stage to the current source transistor. Hence, increasing the output impedance of the current source. Transistors M2 and M3 operate in the cut-off region when they are switched off. They are controlled by complementary bitstream signals, i.e., the current either get steered towards M2 or M3. In addition, an output resistor $R_{out}$ converts the current into voltage.

Figure 13:
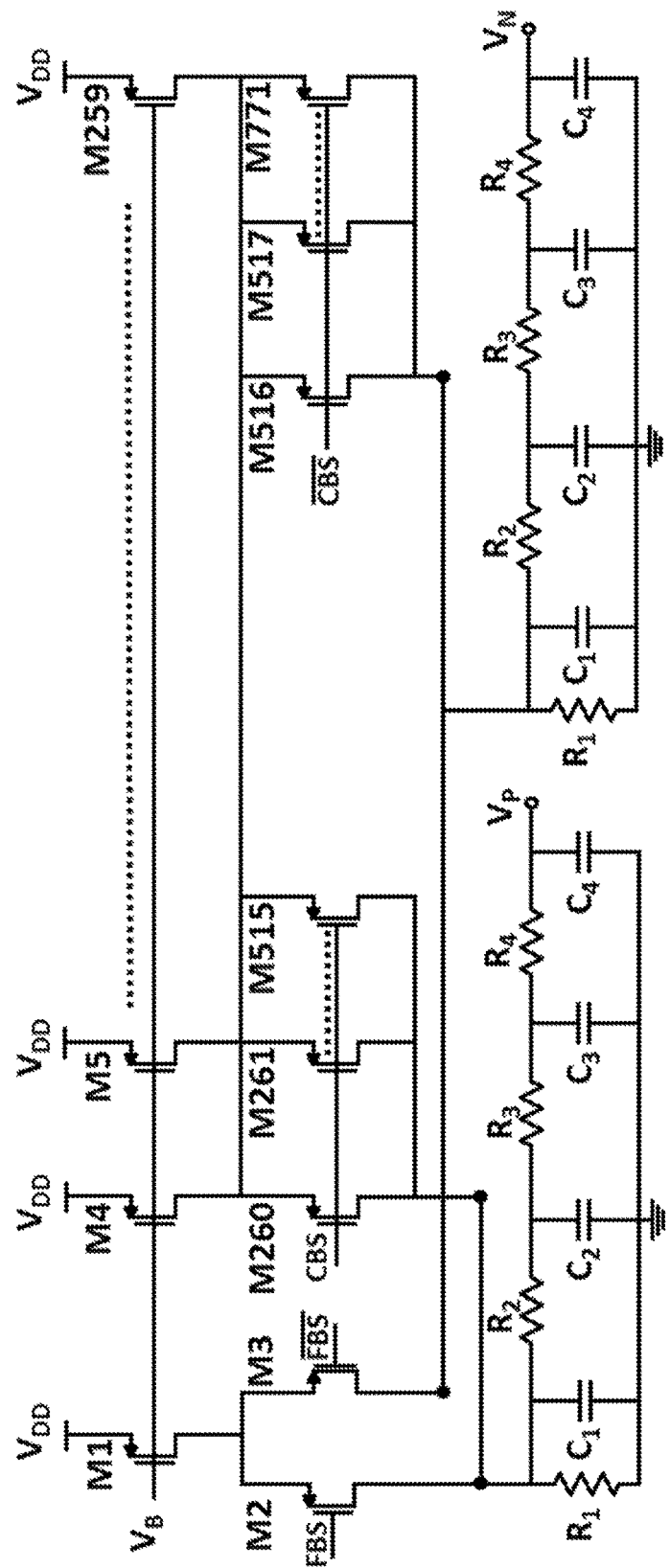
FIG. 13 is a circuit diagram of an example implementation of the DAC 10 core.

FIG. 13 is the circuit implementation of the 16-bit DAC 10 core. Since it is a segmented DAC, the output is the contribution of two sub-DACs: fine and coarse. Again, the fine DAC produces a current km depending on the digital bit-stream FBS and its complement. In much the same way, the coarse DAC delivers a current $L_{course}$ depending on the digital bit-stream CBS and its complement. The two currents are added together at the current summing node and passed on to a Trans-impedance Filter. The fine DAC is built using the current cell depicted earlier in FIG. 12. The coarse DAC is built using 256 current cells connected in parallel, i.e., 256 replicas of the fine DAC. This is done for proper matching between the current sources, to reduce mismatches effect. The coarse current source is implemented by transistors M4-M259, biased by voltage $V_B$. The current switches for the coarse DAC are implemented by M260-M771. All transistors used have the same aspect ratio (400 nm/400 nm). The proposed DAC design is fully differential to remove any non-linearity.

The main function of the Trans-Impedance Filter (TIF) circuit is to transfer the information from current to voltage. This is done through resistor $R_{out}$ depicted in FIG. 12. In addition, the capacitor C1 is used to filter out AC components. In other words, the TIF acts as an LPF and current-to-voltage converter.

Resistors R2-R4 and capacitors C2-C4 make up a conventional RC ladder LPF. This is needed to obtain the desired ripples in the output of the DAC 10.

Typically, the digital bit-streams (FBS 18 and CBS 16) are full swing input waveforms, i.e., rail to rail swing. This limits the analog output voltage range to one transistor threshold. To increase the output voltage range, limited swings are used. Therefore, other circuitry is needed to convert the full swing input to a moderate one. This causes a substantial increase in the overall power consumption. If NMOS transistors are used to build the current cell, the input swing should be low to medium, i.e., $V_{ss}$ to $0.5V_{dd}$. In this design, since PMOS transistors are used, the input swing is medium to high, i.e., $0.5V_{dd}$ to $V_{dd}$. The signals coming from the ΣΔ modulators are full-swing. To convert them to moderate swing a level-shifter is needed.

Figure 14:
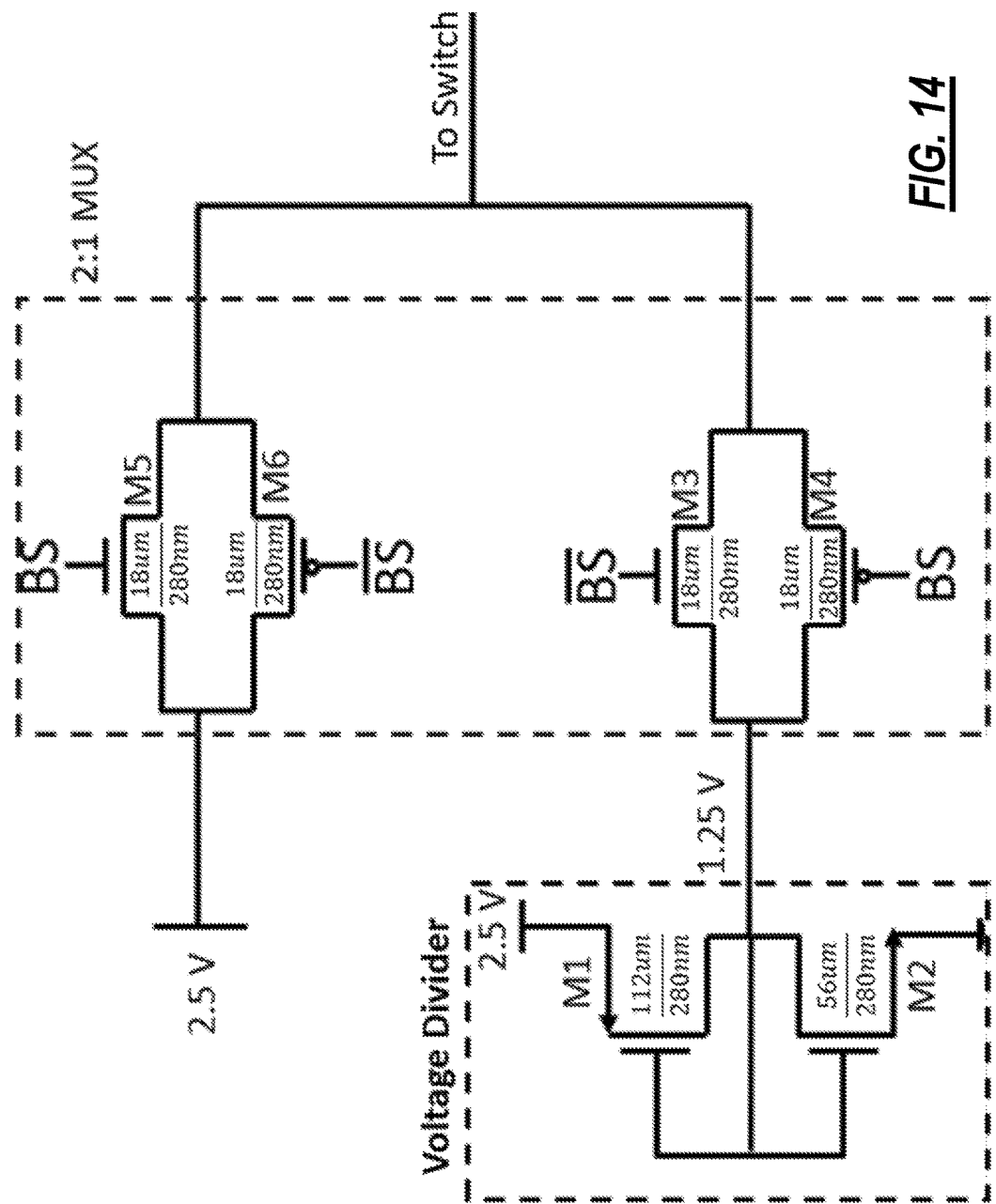
FIG. 14 is a circuit diagram of a level-shifter.

FIG. 14 is a circuit diagram of a level-shifter. The level-shifter is made up of a voltage divider circuit and a 2:1 multiplexer (mux). The voltage divider circuit is used to generate the analog level, which will be then supplied to the current switches. The voltage divider circuit is a circuit that is used to generate on-chip analog voltage levels, it is implemented by building an inverter and connecting the gates of the transistors to the drains of the transistors. The 2:1 mux provides the current switch a $V_{dd}$ (2.5V) or $0.5V_{dd}$ (1.25V) based on the bit-stream BS and its complement input signal.

In an embodiment, the 16-bit DAC 10 using two Sigma-Delta (ΣΔ) modulators 12, 14 fabricated using the 65 nm CMOS process has the following simulation results:

| Parameter | Post-layout Simulation |
| --- | --- |
| Technology | 65 nm |
| Supply Voltage | 2.5 V |
| Resolution | 16-bits |
| $F_s$ | 200 MHz |
| DNL and INL before calibration | 4.4LSB and 6LSB |
| DNL and INL after calibration | 0.39LSB and 0.45LSB |
| DAC Core/Area including LPF | 0.0025 mm$^2$/0.182 mm$^2$ |
| Power | 23.4 mW |

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A X-bit Digital-to-Analog Converter (DAC) circuit comprising:
    an effective X/2-bit coarse DAC configured to produce a coarse bitstream (CBS) from a digital input $DC_1$ using an $n^{th}$ order Sigma-Delta ($\Sigma\Delta$) modulator, and to provide a coarse current source based on the CBS, wherein X is an even integer and n is an integer;
    an effective X/2-bit fine DAC configured to produce a fine bitstream (FBS) from a digital input $DC_2$ using a $1^{st}$ order $\Sigma\Delta$ modulator, and to provide a fine current source based on the FBS; and
    an output configured to form a voltage from the combination of the coarse current source and the fine current source.

2. The DAC circuit of claim 1, wherein
    a first 1-bit DAC is configured to provide the coarse current source based on the CBS, and
    a second 1-bit DAC is configured to provide the fine current source based on the FBS.

3. The DAC circuit of claim 2, wherein a combination of the $\Sigma\Delta$ modulators and each of the first 1-bit DAC and the second 1-bit DAC provides the X-bit resolution.

4. The DAC circuit of claim 2, wherein each of the 1-bit DACs are configured to provide a current value if the respective CBS and FBS are logically high and no current if the respective CBS and FBS are logically low.

5. The DAC circuit of claim 1, wherein the value of n represents the $\Sigma\Delta$ modulator order to be used for the coarse DAC and is selected based on the desired linear range of operation.

6. The DAC circuit of claim 1, further comprising
    a Low Pass Filter (LPF) configured to receive the combination of the coarse current source and the fine current source and to provide the output.

7. The DAC circuit of claim 6, wherein an order of the LPF matches an order of the $n^{th}$ order $\Sigma\Delta$ modulation.

8. The DAC circuit of claim 1, wherein the DAC circuit is calibrated by matching the coarse current source and the fine current source.

9. An integrated circuit comprising:
    a coarse Digital-to-Analog Converter (DAC) including
        an $n^{th}$ order Sigma-Delta ($\Sigma\Delta$) modulator that receives a digital input $DC_1$ and outputs a coarse bitstream (CBS), and
        a coarse 1-bit DAC that operates on the CBS to provide a coarse current source;
    a fine DAC including
        an $1^{st}$ order $\Sigma\Delta$ modulator that receives a digital input $DC_2$ and outputs a fine bitstream (FBS), and
        a fine 1-bit DAC that operates on the FBS to provide a fine current source;
    a summing element connected to the coarse current source and the fine current source; and
    a Low Pass Filter (LPF) connected to the summing element and configured to provide a voltage at an output, the voltage formed as a combination of the coarse current source and the fine current source.

10. The integrated circuit of claim 9, wherein each of the coarse 1-bit DAC and the fine 1-bit DAC are configured to provide a current value if the respective CBS and FBS are logically high and no current if the respective CBS and FBS are logically low.

11. The integrated circuit of claim 9, wherein a value of n in the $n^{th}$ order $\Sigma\Delta$ modulator is selected based on a linear range of operation.

12. The integrated circuit of claim 9, wherein an order of the LPF matches an order of the $n^{th}$ order $\Sigma\Delta$ modulation.

13. The integrated circuit of claim 9, further comprising level-shifting circuitry configured to convert the CBS and the FBS from a full swing input waveform to a moderate swing input waveform.

14. The integrated circuit of claim 9, wherein the integrated circuit is calibrated by matching the coarse current source and the fine current source.

15. A method of operating a Digital-to-Analog Converter (DAC) circuit comprising:
    at a coarse DAC, receiving a digital input $DC_1$, applying $n^{th}$ order Sigma-Delta ($\Sigma\Delta$) modulation on the digital input $DC_1$ to produce a coarse bitstream (CBS), and providing a coarse current source based on the CBS;
    at a fine DAC, receiving a digital input $DC_2$, applying $1^{st}$ order Sigma-Delta ($\Sigma\Delta$) modulation on the digital input $DC_2$ to produce a fine bitstream (FBS), and providing a fine current source based on the FBS; and
    providing a voltage at an output, the voltage formed as a combination of the coarse current source and the fine current source.

16. The method of claim 15, wherein
    a first 1-bit DAC is configured to provide the coarse current source based on the CBS; and
    a second 1-bit DAC is configured to provide the fine current source based on the FBS.

17. The method of claim 15, wherein the value of n represents the $\Sigma\Delta$ modulator order to be used for the coarse DAC and is selected based on the desired linear range of operation.

18. The method of claim 15, further comprising
    utilizing a Low Pass Filter (LPF) to receive the combination of the coarse current source and the fine current source and to provide the output.

19. The method of claim 15, further comprising
    utilizing level-shifting circuitry to convert the CBS and the FBS from a full swing input waveform to a moderate swing input waveform.

20. The method of claim 15, further comprising
    calibrating digitally by matching the coarse current source and the fine current source.

* * * * *